United States Patent [19]

Buliszyn et al.

[11] Patent Number: 5,349,543
[45] Date of Patent: Sep. 20, 1994

[54] CONSTANT FORCE PROBE

[75] Inventors: Stanley Buliszyn, Rhinebeck; James A. Landor, Poughkeepsie; Reuben Q. Zielinski, High Falls, all of N.Y.

[73] Assignee: International Business Machines Corporation, Armonk, N.Y.

[21] Appl. No.: 896,288

[22] Filed: Jun. 10, 1992

[51] Int. Cl.⁵ .............................. G05B 23/02
[52] U.S. Cl. .................... 364/579; 364/508; 364/474.37
[58] Field of Search ............ 364/508, 474.37, 579; 128/652, 776; 277/80; 33/832; 324/158 P

[56] References Cited

U.S. PATENT DOCUMENTS

| | | | |
|---|---|---|---|
| 4,209,021 | 6/1980 | Warming ........................ | 128/652 |
| 4,811,246 | 3/1989 | Fitzgerald, Jr. et al. . | |
| 4,992,728 | 2/1991 | McCord et al. . | |
| 5,012,186 | 4/1991 | Gleason . | |
| 5,012,591 | 5/1991 | Asakawa . | |
| 5,040,306 | 8/1991 | McMurtry et al. . | |
| 5,062,310 | 11/1991 | Eaton ........................... | 277/80 |
| 5,131,166 | 7/1992 | Weber .......................... | 33/832 |
| 5,144,753 | 9/1992 | Murphy ........................ | 128/776 |

Primary Examiner—Jack B. Harvey
Assistant Examiner—Thomas Peeso
Attorney, Agent, or Firm—Aziz M. Ahsan

[57] ABSTRACT

A constant force probe to test electrical and electronic circuits is disclosed whereby the magnetic repulsion between a magnet supporting the probe tip and an electromagnet contained within a housing is used to deform a load cell which provides an electrical output representative of the force of engagement between the probe and the test specimen. The electronic output signal from the load cell then is used for comparison purposes with preset signals, and the electrical current to the electromagnet within the probe housing is modulated to adjust the force exerted by the probe onto the workpiece by changing the flux density of the magnetic field generated by the electromagnet.

6 Claims, 2 Drawing Sheets

CONSTANT FORCE PROBE

FIELD OF THE INVENTION

This invention relates to test probes for purposes of testing and/or probing electronic circuits and more particularly, to the regulation of force with which the test probe tip is engaged with the test specimen.

BACKGROUND OF THE INVENTION

In electrical circuit testing for continuity of conductive paths on electronic devices, probing of contacts to meter and read voltages, or other related electronic data from electronic devices, it is usual to use a probe to contact the conductive path and thus provide the input contact and path to the appropriate measuring or recording instrumentation. When probing by hand, the force which is applied to the probe neither is controlled nor constant, and the force variations often create measurement errors due to the varying contact resistance between the probe tip and the electrical circuit element. Moreover, when the instrumentation is automated using robotics to position the probes, spring loaded pins are often used to compensate for over-travel of the robotic device which occurs due to the lack of positioning accuracy by the robotic device or due to height variations in the test specimen. When the robotic device positions the probe and if the probe housing position is too close to the test specimen, excessive force may be exerted on the test specimen which may damage either the probe or the test specimen. If the robotic device does not position the probe housing closely enough to the test specimen, sufficient engagement force to assure adequate conductivity between the tip and specimen may not occur.

Measurement errors can be a result of the variance of the contact resistance or, more particularly, may be due to the variances of the forces exerted by any springs of the spring-type pins used to force the probe tip against the test specimen. Spring pins are forced against the specimen with a force that is a function of displacement of the pin and the spring constants, and may engage the specimen with a force which varies widely.

Attempts have been made in the past to compensate for the forces exerted on probe tips in many different environments. An example of a probe tip that is supported on a cantilevered parallel spring beam arrangement is U.S. Pat. No. 5,012,591 to Asakawa, and assigned to Fujitsu, Ltd. The above patent discloses that the deflection of the springs is detected by a spring gauge which controls the DC motor used to position the probe head and a voice coil motor to compensate for the forces generated by the beam springs.

U.S. Pat. No. 5,040,306 to McMurtry et al., and assigned to Renishaw plc., discloses a probe mechanism for measuring the profile of an object, and the probe tip is positioned in contact with the work piece. The probe shaft is translated within the probe housing and a force exerted upon it by a motor. The displacement of the probe tip deflects supporting springs, and the force of the springs is detected as a function of the displacement of the probe tip by a transducer. This data is then used to calculate the information relating to the spatial position of the contact point between the probe tip and the object being measured.

The present invention utilizes magnetic repulsion, which is yielding and compliant, to avoid damage to the probe while at the same time permits control of the force exerted on the probe by the magnetic repulsion; the force which the probe exerts on the test specimen insures that the test specimen and probe are not damaged while adequately engaged for reliable test measurements.

The probe tip is mounted on a magnetic member which is repelled by an electromagnet to exert the desired force level on the test specimen. The control of the force insures that a consistent force of engagement is applied at each test site for damage control and/or consistent test results. The force level is controlled by the amount of electrical current permitted to pass through the coils of the electromagnet. A force sensing device such as a load cell is used to provide an indication of the force exerted on it by the electromagnet being repelled from the magnetic plunger of the probe structure. The output signal of the load cell is converted to digital information, compared with preset values representing desired loads, and adjusted through a digital-to-analog converter and a Darlington transistor network to control the current from the power supply to the coil windings of the electromagnet within the probe housing.

The subject probe and its control may be better understood from references to the drawings and to the detailed description to follow.

DRAWINGS

FIG. 3 illustrates an alternate embodiment of the invention.

DETAILED DESCRIPTION OF THE BEST MODE OF THE PREFERRED EMBODIMENT FOR CARRYING OUT THE INVENTION

Figure 1:
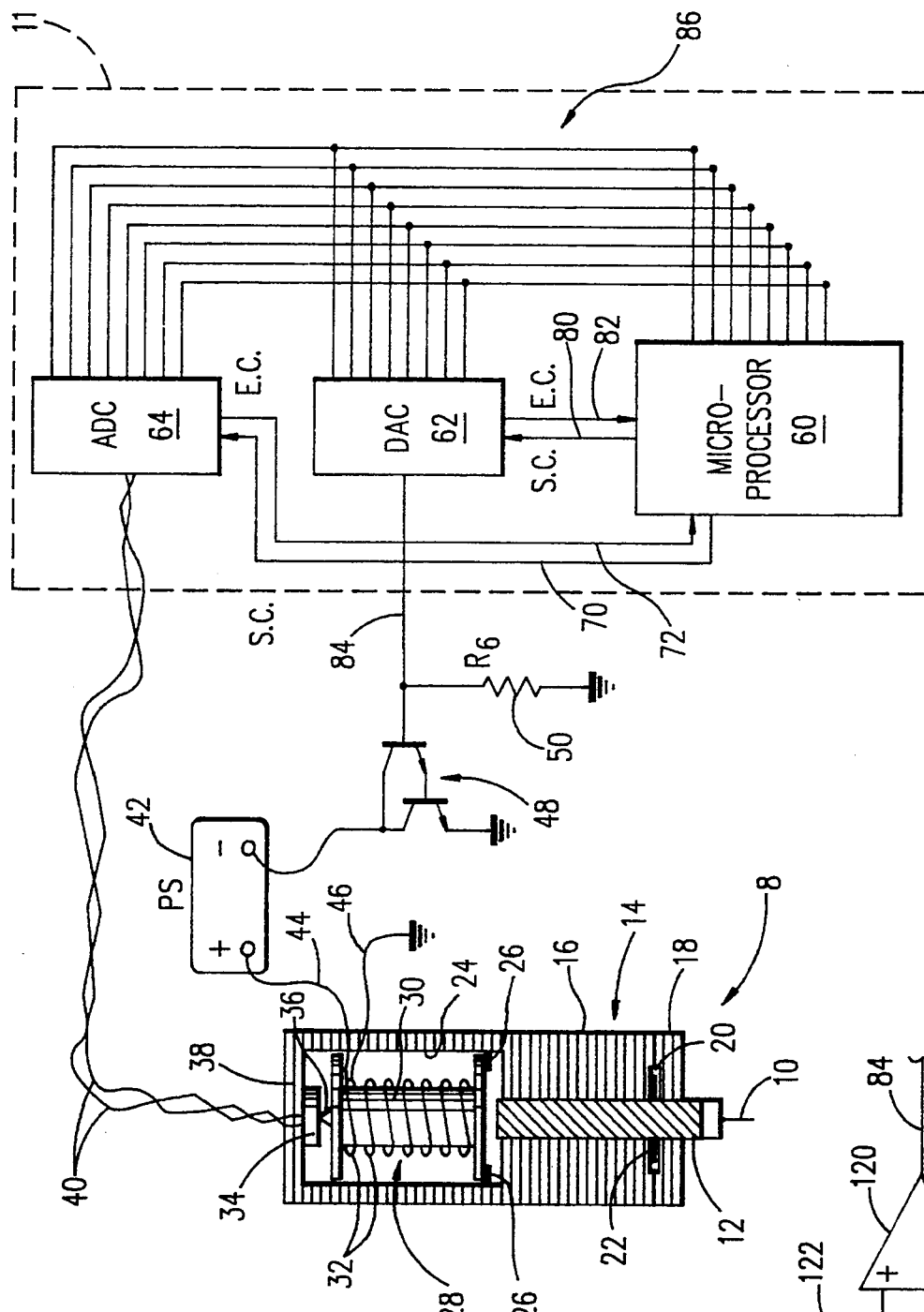
FIG. 1 illustrates the construction of the constant force probe together with its associated electronic controls.

Referring to FIG. 1, the probe 8 and its control electronics 11 are shown in a schematic arrangement. The probe tip 10 is the portion of the probe 8 which is typically engageable with the contact points on an electronic circuit or device for testing and is provided with electrical leads to convey the appropriate electrical signals to the signal analyzer or test equipment, not shown. Both the probe tip 10 and the electrical analyzing equipment are conventional and do not form a portion of this invention.

Probe tip 10 is carried upon the end of a ferromagnetic sleeve or plunger 12. The ferromagnetic plunger 12 provides a movable support for probe tip 10.

The probe assembly 14 is comprised of probe body 16 and end cap 18. Surrounding the plunger 12 on which probe tip 10 is mounted, there is provided a flange 22 which is enclosed within a chamber 20 formed by a recess in one or both of the probe body 16 and end cap 18. Inasmuch as the flange 22 is contained within the chamber 20 and flange 22 is rigidly fixed to ferromagnetic plunger 12, the plunger 12 and probe tip 10 may move along the axis of the plunger 12 for a limited distance. The distance is controlled by the axial dimension of chamber 20.

Further, probe body 16 is provided with a cylindrical bore or chamber 24 which extends in the axial direction of the probe body 16. This bore or chamber 24 is formed to contain an electromagnet 28. Electromagnet 28 is movable within chamber 24 to a limited extent. The electromagnet may move upwardly as in FIG. 1 or away from ferromagnetic plunger 12. Movement of the electromagnet 28 is restricted in the opposite direction by stop flanges 26 attached to the interior walls of the chamber 24. An alternative stop could be constructed of a non-magnetic plastic in the form of a washer or annular disk of a desired thickness and the washer may be positioned and fixed in the bottom of bore 24.

Electromagnet 28 is movable along its axis, to a very limited degree, to engage the loading point 36 of the load cell 34. Load cell 34 is attached to and supported by the top end cap 38 of the probe housing 14. Load cell signal-lines 40 are connected from the load cell 34 to the analog to digital converter (ADC) 64. ADC 64 converts the analog signal on lines 40 to an eight bit digital signal which can then be received and used by the microprocessor 60. ADC 64 and microprocessor 60 are connected by an eight conductor bus 86 which is also connected to the digital to analog converter (DAC) 62. The microprocessor 60 is provided with control lines 70, 72 for controlling ADC 64 and control lines 80 and 82 for controlling the DAC 62. DAC 62 is provided with an output analog signal line 84 which is connected to one end of a resistance 50 while the other end of resistance 50 is grounded. This resistor 50 creates a bias on the base of one of the transistors of the Darlington transistor circuit 48. The analog signal line 84 is further connected as an input to the Darlington transistor circuit 48 which modulates the output of power supply 42.

Power supply 42 is provided with a voltage line 44 which provides the voltage for the windings 32 of the electromagnet 28. The core 30 of the electromagnet 28 is typically a soft iron material. The windings 32 on the electromagnet 28 terminate through the ground wire 46.

The constant force probe 8 utilizes the principle of magnetic repulsion to cause the probe tip 10 to be engaged with a controlled constant force against whatever contact or conductive surface it is positioned. As the probe tip 10 is engaged with its test specimen, the plunger 12 will tend to move upward in FIG. 1 within the travel limits defined by the axial length of chamber 20 and flange 22.

As the ferromagnetic plunger 12 is displaced toward electromagnet 28, and a voltage is applied to the windings 32 of electromagnet 28, the magnetic field generated by the electromagnet 28 will tend to repel the ferromagnetic plunger 12; plunger 12 is incapable of being moved away from the electromagnet 28 because the probe tip 10 is engaged with some force against the test specimen.

As the magnetic repulsion occurs between the plunger 12 and electromagnet 28, the electromagnet will tend to be displaced upwardly in FIG. 1 and engage the load point 36 on load cell 34. The force of repulsion created by the electromagnet 28 and the ferromagnetic plunger 12 will be translated into a force of engagement against load cell 34 causing its deformation. As the load cell 34 deforms, an analog signal representative of the deformation of the load cell 34 will be conducted over load cell signal lines 40 to the analog digital converter 64. The ADC 64 will convert that analog signal and provide a digital output over bus 86 to the microprocessor 60. Under suitable program control, the microprocessor 60 then can send a signal over start conversion line 70 to the analog digital converter to convert the analog signal to a digital signal and to insure that the appropriate digital signals are impressed upon bus 86; the microprocessor may then read those signals. At the end of the sampling period and after all the signals have been impressed upon the bus 86 by ADC 64, the ADC 64 will send an end conversion signal over line 72 to microprocessor 60 signaling completion of the task. With detection of the value of the signal on bus 86, the microprocessor 60 may use bus 86 to send an appropriate digital value to the DAC 62. This digital value then is loaded into DAC 62 by a start conversion signal over line 80; after the digital signal loaded into DAC 62 has been received, an end conversion signal 82 is returned to the microprocessor 60 completing the handshaking between the two devices. As the digital value that was transmitted from the microprocessor 60 to the DAC 62 is converted to an analog signal, it is impressed upon analog signal line 84 which then acts to control the Darlington transistor network 48. By impressing the analog signal of varying value or strength on analog signal line 84, the Darlington transistor network 48 is caused to vary its conductance from the negative terminal of power supply 42 to ground; this action accordingly causes a varying signal on the positive voltage line 44, windings 32 and ground line 46.

As the signal on line 44 varies, the magnetic strength or flux density of the field created by electromagnet 28 will vary. As that magnetic field strength varies, the repulsive force between the electromagnet 28 and the plunger 12 will vary likewise as a function of the flux density of electromagnet 28. The only substantive resistance to the varying repulsive force exerted on electromagnet 28, is the load point 36 of load cell 34. The reactive force on the load cell 34 will vary creating a similarly varying output on signal lines 40.

As the signal on lines 40 varies, the microprocessor 60 will continually sample the ADC 64 through the handshaking control by start conversion 70 and end conversion line 72. As the continuing sampling occurs, the values on bus 86 will be conveyed to microprocessor 60 and a value representative of the desired output of DAC 62 fed to DAC 62 in order to modulate the current flow through Darlington transistor network 48, thereby varying the current flow through line 44, windings 32 and ground line 46. The microprocessor 60 can thus adjust the amount of repulsive force exerted between the electromagnet 28 and the ferromagnetic sleeve or plunger 12 to cause a controlled engagement of the probe tip with the test specimen. The control of the probe force levels is accomplished by the use of the microprocessor 60 under program control. The microprocessor 60 is typically attached to a keyboard and display as is conventional and, not shown, therefore, as that connection is not a part of the subject invention but only referred to for complete description of the device.

The program control may be written by a programmer of ordinary skill in the art of programming for a microprocessor of their choice, but the preferred microprocessor 60 is an Intel 8051. The logical operation of the microprocessor 60 is illustrated by the flow diagram of FIG. 2. At power on, the Input/Output ports of the microprocessor are configured, the keyboard polled for any inputs, and the display updated to display current information in operation 100.

Thereafter, the desired force value is inputted to the microprocessor 60, in operation 102. This value will serve as the target force value to which the system will work to adjust the force of the probe tip 10 on the specimen.

The sampling of the ADC 64 for a load cell force signal is accomplished in operation 104. The microprocessor 60 controls the sampling by the handshaking signals over start conversion line 70 and end conversion line 72. When start conversion line 70 is pulsed, the ADC 64 is enabled to output the digital value of the analog signal on lines 40 to the bus 86. The digital value will appear at the Input/Output ports (I/O ports) of the microprocessor 60. The I/O ports are polled and the data collected from the ports and stored in the microprocessor 60 for later use.

After the microprocessor acquires the digital value of the load cell 34 force signal in operation 104, that value is compared in operation 106 to the desired force level entered into the microprocessor 60 in operation 102 to determine if the desired force value is greater than the load cell force value. If the desired force value is larger, resulting in an affirmative determination in operation 106, the signal to the DAC 62 is incremented to increase the load cell force and the load cell signal on lines 40. When the incremented signal is sent to the DAC 62, over bus 86, the DAC 62 is enabled to receive the signal by the start conversion line 80 and the DAC 62 will indicate the completion of the conversion on line 82.

The newly incremented value for the force will be converted to the analog control signal needed to control the current flow in the windings 32 of electromagnet 28, by the DAC 62. With the newly converted value, as an analog signal in line 84, the Darlington transistor circuit 48 will permit a larger current flow and thus a stronger magnetic field will be generated by the electromagnet 28.

Thereafter, the ADC 64 is polled again in operation 110, identically to the polling in operation 104 with the flow to operation 106. Alternatively, the flow could be to operation 104, skipping operation 110.

At operation 106, if the determination is in the negative indicating that load cell force value is greater than or equal to the desired force value from the ADC 64, the flow branches to operation 112 where the two values are compared to determine if they are equal. If the two values are equal, then the flow is to operation 118 where the keyboard input to the microprocessor 60 is polled to get any new force value which may have been entered.

On the other hand, if the determination in operation 112 is in the negative, the desired force value is less than the load cell force value and the DAC 62 is decremented to decrease the analog signal on line 84 thereby decreasing the strength of the magnetic field of electromagnet 28.

After the adjustment of the value sent to DAC 62 in operation 116, the logic flow is directed to operation 110; the process continues to loop to continue to adjust the force of the probe tip 10 on the test specimen.

Figure 2:
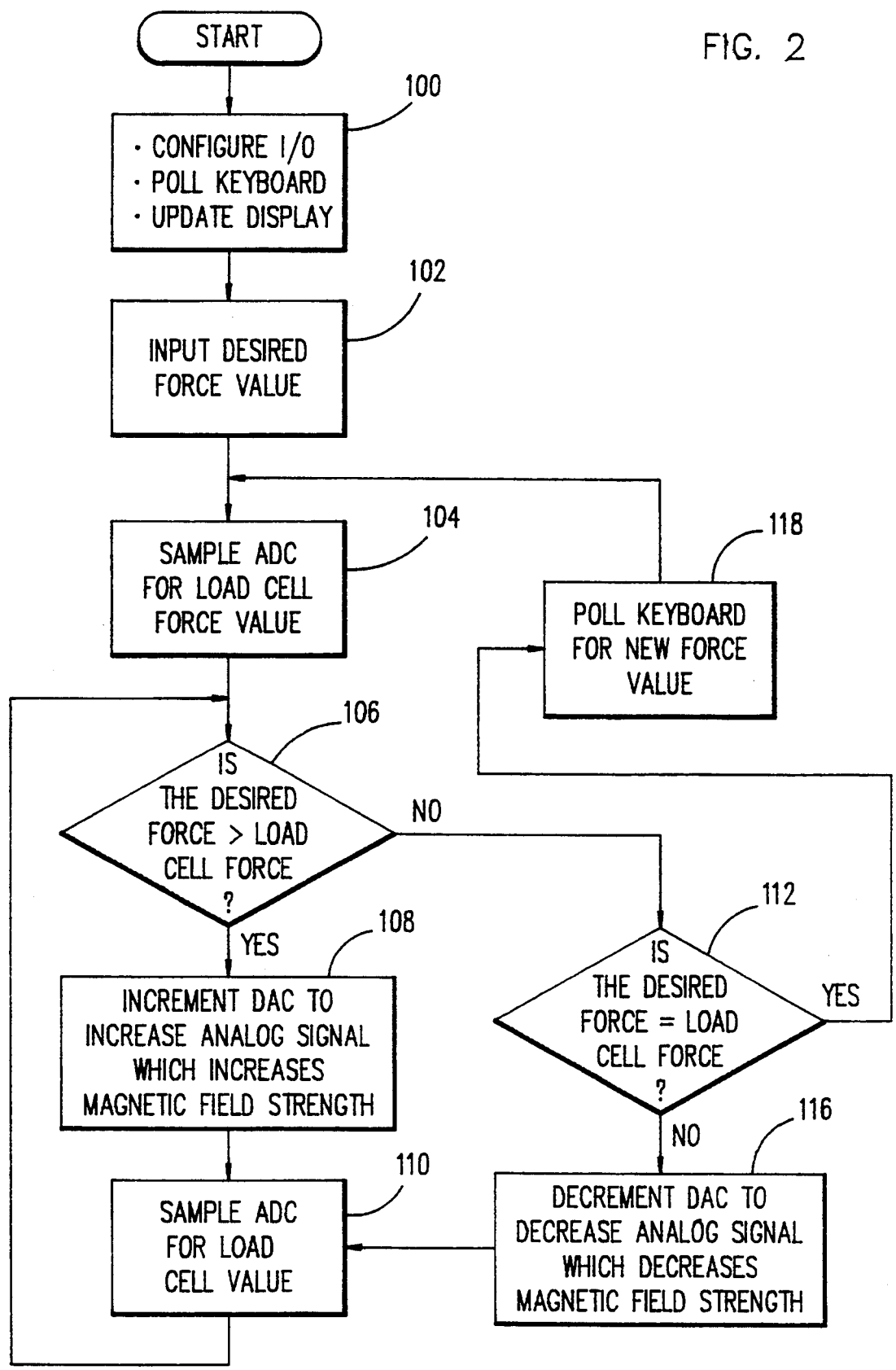
FIG. 2 illustrates a logic flow diagram of the operations of the microprocessor in controlling the amount of force exerted by the constant force probe on a test specimen.

A programmer of ordinary skill in the art will be able to write an appropriate program listing of commands for the chosen microprocessor to control the probe, using the flow diagram in FIG. 2 as a guide and utilizing the explanation above.

This particular type of constant force probe 8 and controls 11 is very advantageous. As a hand-held device, the force of engagement will vary due to the inability of the person to control the force precisely. The force exerted by the robotic apparatus is not necessarily controllable inasmuch as the robotic device will position the probe 8 at a known spatial location. Very small variances in the positioning of the test specimen can result then in large variances in force of engagement. By providing a signal to the electromagnet 28 and detecting feedback information to vary that signal, the force with which the probe tip 10 may be engaged with the test specimen can be controlled in a very precise manner.

If desired, the electronic controls 11 may be removed and the circuit of FIG. 3 may be substituted therefore. One of the signal lines 40 from the load cell 34 is connected to the non-inverting input of the comparator 120. The other one of signal lines 40 is grounded. A reference voltage is provided by connecting $+V_B$ through a voltage divider network of resistors 122, 124, to ground. The reference voltage for the comparator 120, at the junction of resistors 122, 124 is determined by the relative values of resistors 122, 124 and the value of $+V_B$. The reference voltage $V_{ref}$ is connected to the inverting input of comparator 120. $V_{ref}$ is sensed by comparator 120 and compared to the voltage on signal line 40 connected to the other input of comparator 120.

When the voltage from the load cell 34, on lines 40 is larger than that of $V_{ref}$, the comparator output decreases negatively and will cause Darlington transistor circuit 48 to conduct less current and therefore reduce the magnetic field strength, thereby reducing the repulsion of plunger 12 by electromagnet 28. Conversely, when the voltage output of the load cell 34 is smaller than $V_{ref}$, the comparator output increases increasing the repulsion between the electromagnet 28 and the plunger 12.

The illustration of the electronic controls 11 comprising a microprocessor 60 is preferred and also the best mode contemplated by the inventor hereof; however, other appropriate feedback controls such as the comparator circuit of FIG. 3 may be utilized if desired. The primary consideration must be that very small amounts of force are detected by the load cell 34 and even smaller variations in the force of the probe tip 10 against the specimen must be detected and converted to a signal which can then be analyzed and used to compensate, through the electrical network and, thereby, adjust the current flow through the electromagnet, thus controlling the flux density generated by the electromagnet. As the probe body 14 is moved toward the test specimen and the probe tip 10 engages the surface of the test specimen, further movement of the probe body 14 will increase the magnetic repulsion of the electromagnet 28 against the magnetic probe plunger 12 and as the probe plunger 12 is then more strongly repulsed, the load cell 34 will detect the higher level of force exerted by the magnetic repulsion and reduce the current flow through line 44 and the coils of the windings 32. In turn, this will reduce the magnetic repulsion to maintain a constant force of the probe tip 10 against the test specimen.

It should be recognized that the probe tip 10 could be attached to an electromagnet similar to the one shown as 28 and the ferromagnetic material of plunger 12 be formed into a cylindrical plunger engaging the load cell; the probe tip would then tend to move the electromagnet as opposed to moving the plunger, as is illustrated in the drawing. It should be understood that minor changes and modifications may be made to the invention without departing from the scope of the claims.

We claim:

1. A constant force probe for engagement with a workpiece, comprising:

a housing;

a probe tip, having an axis, partially contained within said housing and constrained for limited movement within said housing along the axis of said probe tip;

said probe tip comprising a permanently magnetic portion at least partially contained within said housing;

an electromagnet contained within said housing and constrained for movement within said housing;

a sensing means for sensing force exerted thereon by said electromagnet;

an electrical energy source connected to said electromagnet to energize said electromagnet with an electrical current;

electronic control means for regulating said electrical current to control repulsive forces between said magnetic portion and said electromagnet;

said electronic control means responsive to said sensing means;

whereby said probe tip is forced against said workpiece by magnetic repulsion force between said magnet and said electromagnet and said repulsion force is sensed by said sensing means and controlled responsive to said sensing means by said electronic control means by varying said electrical current to said electromagnet.

2. The constant force probe of claim 1 further comprising electronic control means which comprises:

a current controller;

a digital processor;

an analog to digital converter and a digital to analog converter each connected to said processor and connected to receive signals from said sensing means and send signals to said electrical current controller respectively for modulating said electrical current.

3. The probe of claim 2 wherein said current controller comprises a Darlington transistor network.

4. The probe of claim 2 wherein said processor, said digital to analog converter and said analog to digital converter all share a common bus.

5. The probe of claim 1 wherein said electromagnet and said magnetic portion are disposed to magnetically oppose the other.

6. The constant force probe of claim 1 further comprising electronic control means which comprises:

a current controller;

a voltage comparator;

a reference voltage supplied to one input terminal of said comparator;

a voltage from said sensing means supplied to another input terminal of said comparator; and an output voltage representative of the relative magnitudes of said reference voltage and said voltage from said sensing means, connected to said current controller, whereby variations in said voltage from sensing means will be manifested as a voltage to control said current controller and thereby control said electromagnet.

* * * * *